United States Patent
Vatus et al.

(10) Patent No.: US 9,058,988 B2
(45) Date of Patent: Jun. 16, 2015

(54) METHODS FOR DEPOSITING LAYERS HAVING REDUCED INTERFACIAL CONTAMINATION

(75) Inventors: Jean R. Vatus, San Jose, CA (US); Jinsong Tang, Livermore, CA (US); Yihwan Kim, Milpitas, CA (US); Satheesh Kuppurao, San Jose, CA (US); Errol Sanchez, Tracy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 119 days.

(21) Appl. No.: 12/717,266

(22) Filed: Mar. 4, 2010

(65) Prior Publication Data

US 2010/0255661 A1    Oct. 7, 2010

Related U.S. Application Data

(60) Provisional application No. 61/157,818, filed on Mar. 5, 2009.

(51) Int. Cl.
| | |
|---|---|
| *H01L 21/00* | (2006.01) |
| *H01L 21/02* | (2006.01) |
| *C23C 16/02* | (2006.01) |
| *C23C 16/24* | (2006.01) |

(52) U.S. Cl.
CPC ...... *H01L 21/02538* (2013.01); *C23C 16/0245* (2013.01); *C23C 16/24* (2013.01); *H01L 21/02381* (2013.01); *H01L 21/02532* (2013.01); *H01L 21/02661* (2013.01)

(58) Field of Classification Search
CPC ..... H01L 21/20; H01L 21/36; H01L 21/2033; H01L 21/02019; H01L 21/02057; H01L 21/02628
USPC .......................... 438/478, 690, 706, 723, 734
See application file for complete search history.

(56) References Cited

U.S. PATENT DOCUMENTS

| | | | |
|---|---|---|---|
| 5,589,421 A * | 12/1996 | Miyashita et al. | 438/758 |
| 5,895,245 A | 4/1999 | Harvey et al. | |
| 6,348,420 B1 * | 2/2002 | Raaijmakers et al. | 438/769 |
| 6,958,286 B2 * | 10/2005 | Chen et al. | 438/602 |
| 6,967,167 B2 * | 11/2005 | Geiss et al. | 438/704 |

(Continued)

FOREIGN PATENT DOCUMENTS

| | | |
|---|---|---|
| JP | H01-225127 A | 9/1989 |
| JP | H03-270236 A | 12/1991 |
| KR | 10-2003-0054726 A | 2/2003 |

OTHER PUBLICATIONS

International Search Report and Written Opinion mailed Oct. 27, 2010 for PCT Application No. PCT/US2010/026174.

*Primary Examiner* — Charles Garber
*Assistant Examiner* — Evren Seven
(74) *Attorney, Agent, or Firm* — Moser Taboada; Alan Taboada

(57) ABSTRACT

Methods of depositing layers having reduced interfacial contamination are disclosed herein. The inventive methods may advantageously reduce contamination at the interface between deposited layers, for example, between a deposited layer and an underlying substrate or film. In some embodiments, a method of depositing a layer may include annealing a silicon-containing layer having a first layer disposed thereon in a reducing atmosphere; removing the first layer using an etching process to expose the silicon-containing layer after annealing; and depositing a second layer on the exposed silicon-containing layer.

19 Claims, 4 Drawing Sheets

(56) References Cited

U.S. PATENT DOCUMENTS

| | | |
|---|---|---|
| 7,396,480 B2 | 7/2008 | Kao et al. |
| 7,494,545 B2 | 2/2009 | Lam et al. |
| 2002/0028585 A1* | 3/2002 | Chung et al. ............ 438/765 |
| 2002/0192974 A1* | 12/2002 | Ahn et al. ............... 438/722 |
| 2005/0191858 A1* | 9/2005 | Fukunaga et al. ....... 438/691 |
| 2006/0051966 A1 | 3/2006 | Or et al. |
| 2006/0130971 A1 | 6/2006 | Chang et al. |
| 2006/0228900 A1* | 10/2006 | Dip et al. ............... 438/774 |
| 2007/0048995 A1* | 3/2007 | Kawanami et al. ...... 438/597 |
| 2007/0181057 A1 | 8/2007 | Lam et al. |
| 2007/0224787 A1* | 9/2007 | Weeks et al. ........... 438/483 |
| 2007/0298591 A1* | 12/2007 | Cha ......................... 438/478 |
| 2008/0153266 A1* | 6/2008 | Leys et al. .............. 438/479 |
| 2009/0298288 A1* | 12/2009 | Seino et al. ............ 438/683 |

\* cited by examiner

METHODS FOR DEPOSITING LAYERS HAVING REDUCED INTERFACIAL CONTAMINATION

CROSS-REFERENCE TO RELATED APPLICATIONS

This application claims benefit of U.S. provisional patent application Ser. No. 61/157,818, filed Mar. 5, 2009, which is herein incorporated by reference in its entirety.

FIELD

Embodiments of the present invention generally relate to substrate processing methods, and more specifically to depositing layers on a substrate.

BACKGROUND

As the critical dimensions of devices, such as transistors, memory, photovoltaic cells or the like continue to shrink, the interface between components of such devices becomes substantially more critical. For example, undesired contaminants at the interface between components may result in increased junction resistance, parasitic capacitance, or other such undesired effects. For example, prior to the deposition of a layer on a substrate or film, a native oxide may be removed to prepare the surface of the substrate or film for deposition of the layer. The inventors have discovered that removal of the native oxide is not sufficient and that contaminants remain on the surface of the substrate or film in higher than acceptable concentrations, which results in contamination at the interface when a layer is subsequently deposited on the substrate. Although a high temperature anneal (e.g., >about 700 Celsius in a hydrogen ($H_2$) atmosphere) performed after the removal of the native oxide can be used to remove the contaminants, the inventors believe that the high energy requirements and decreased process throughput associated with the high temperature anneal are undesirable.

Accordingly, the inventors have provided methods for reducing contamination at the interface between a deposited layer and an underlying substrate or film.

SUMMARY

Methods of depositing layers having reduced interfacial contamination are disclosed herein. The inventive methods may advantageously reduce contamination at the interface between deposited layers, for example, between a deposited layer and an underlying substrate or film. In some embodiments, a method of depositing a layer may include annealing a silicon-containing layer having a first layer disposed thereon in a reducing atmosphere; removing the first layer using an etching process to expose the silicon-containing layer after annealing; and depositing a second layer on the exposed silicon-containing layer. In some embodiments, the silicon-containing layer is silicon (Si) and the first layer is silicon dioxide ($SiO_2$). Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
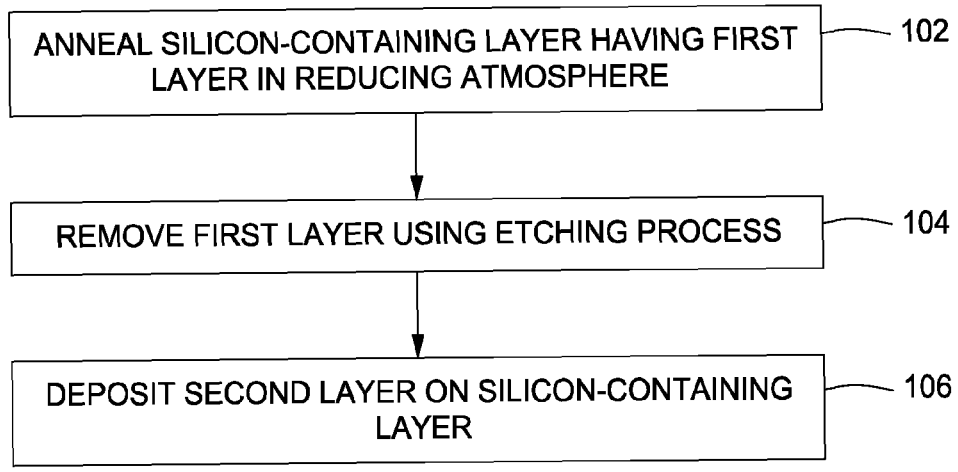
FIG. 1 depicts a flow chart for a method of depositing a layer in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods of depositing layers having reduced interfacial contamination are disclosed herein. The inventive methods advantageously reduce contamination at the interface between deposited layers, for example, between a deposited layer and an underlying substrate or film.

FIG. 1 depicts a flow chart for a method of depositing a layer in accordance with some embodiments of the present invention. The method 100 is described below in accordance with the stages of depositing a layer as depicted in FIGS. 2A-C.

Figure 2A:
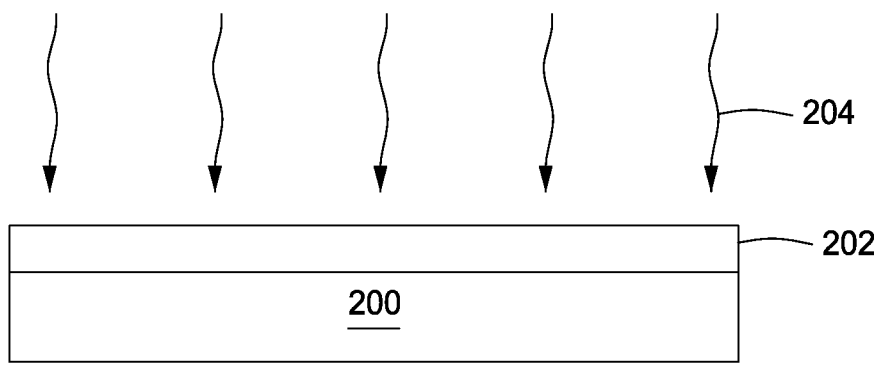
FIGS. 2A-C depict the stages of depositing a layer in accordance with the method described in FIG. 1.
Figure 2B:
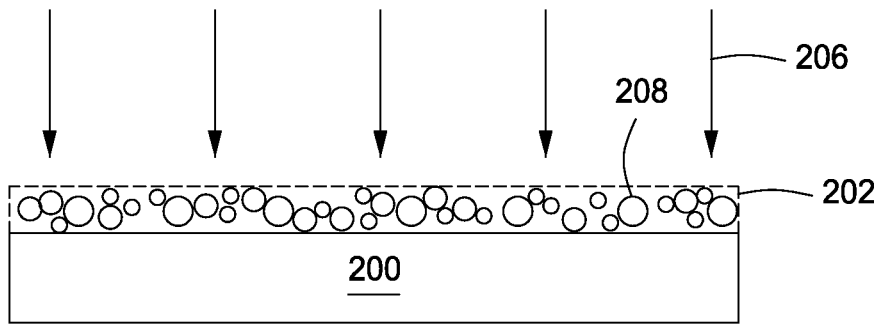
Figure 2C:
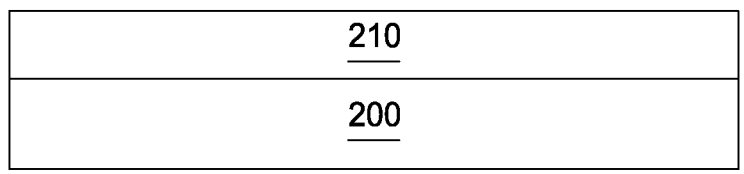

The method 100 begins at 102 by annealing a silicon-containing layer 200 having a first layer 202 disposed thereon in a reducing atmosphere 204 as shown in FIG. 2A. The silicon-containing layer can include a substrate, a deposited film or the like. In some embodiments, the silicon-containing layer comprises at least one of silicon (Si), silicon germanium (SiGe), silicon carbon (SiC), silicon phosphorus (SiP), silicon boron (SiB), silicon germanium boron (SiGeB), silicon germanium phosphorus (SiGeP), or silicon carbon phosphorus (SiCP).

The first layer 202 may be any suitable layer which requires removal and may result in undesired contaminants on the surface of the silicon-containing layer 200. For example, the first layer 202 may include a native oxide layer, a deposited oxide layer, a patterned layer, a photoresist, a masking layer, or the like. In some embodiments, the first layer 202 is an oxide layer. For example, the first layer 202 may include a silicon oxide ($SiO_x$). In some embodiments, the first layer is silicon dioxide ($SiO_2$).

The reducing atmosphere 204 may be any suitable reducing atmosphere, for example, comprising reducing species in a non-plasma and/or plasma state. For example, and in some embodiments, the reducing atmosphere 204 comprises a reducing gas including hydrogen ($H_2$), or a mixture of hydrogen ($H_2$) and at least one inert gas such as nitrogen ($N_2$), or a noble gas, such as argon (Ar), helium (He), or the like. In some embodiments, a plasma is formed from the reducing gas.

During the annealing step 102, the reducing gas can be provided at a flow rate ranging from about 1 slm to about 50 slm. In some embodiments, the reducing gas is provided at about 20 slm. Any suitable pressure may be maintained in a process chamber suitable for performing the annealing step 102, for example, an epitaxial deposition chamber or another such chamber capable of providing a non-plasma and/or plasma reducing atmosphere. In some embodiments, the pressure may be maintained in a non-limiting range of about 1 Torr to about 1000 Torr.

During the annealing step 102, the silicon-containing layer 200 can be annealed, for example, by providing heat via a resistive heater or other suitable heating mechanism disposed in a substrate support of a process chamber. Alternatively or in combination, heat lamps or other energy sources may be utilized to facilitate heating the substrate to the annealing temperature. In some embodiments, the silicon-containing layer 200 is annealed at a temperature ranging from about 100 to about 700 degrees Celsius. In some embodiments, the silicon-containing layer 200 is annealed at a temperature ranging from about 300 to about 700 degrees Celsius. In some embodiments, the silicon-containing layer 200 is annealed at a temperature ranging from about 500 to about 700 degrees Celsius.

The annealing step 102 may continue for a duration of time necessary to anneal the silicon-containing layer 200 and first layer 202. In some embodiments, the silicon-containing layer is annealed for a duration of up to about 1 minute. In some embodiments, the silicon-containing layer is annealed for a duration of less than about 30 seconds. In some embodiments, the silicon-containing layer is annealed for a duration ranging from about 5 to about 10 seconds.

After the annealing step 102, the silicon-containing layer 200 and the first layer 202 can be cooled, for example, in an inert atmosphere, such as nitrogen ($N_2$) or any suitable inert gas, such as a noble gas. The layers 200, 202 can be cooled in-situ in the process chamber where the annealing step 102 is performed, or alternatively, transferred under an inert atmosphere, for example, such as by a transfer robot of a cluster tool, such as a system 500 (e.g., cluster tool) discussed below, and cooled in the transfer chamber (such as a first stage transfer chamber 506 or a second stage transfer chamber 508), a designated cooling chamber (not shown), or in a process chamber configured to remove the first layer 202, such as the process chamber 400 discussed below.

At 104, the first layer 202 is removed using an etching process (as illustrated in FIG. 2B) to expose the silicon-containing layer 200. The etching process may be a dry etching process. For example, in some embodiments, the etching process includes etching the first layer 202 with a plasma 206 formed from an etchant gas. The etchant gas may include at least one of nitrogen trifluoride ($NF_3$), ammonia ($NH_3$) or the like. In some embodiments, the etchant gas includes nitrogen trifluoride ($NF_3$) and ammonia ($NH_3$).

The plasma 206 can be applied while maintaining the silicon-containing layer 200 and the first layer 202 at a temperature of about room temperature, or about 30 degrees Celsius. In some embodiments, the plasma can interact with the first layer 202 to at least partially convert the first layer 202 into a sublimable solid 208. For example, when the first layer 202 is silicon dioxide ($SiO_2$) and the plasma is formed from an etchant gas including $NF_3$ and $NH_3$, a sublimable solid, such as ammonium silicon fluoride (($NH_4)_2SiF_6$) may be formed.

The etching process can further include removing the sublimable solid 208 by annealing the silicon-containing layer 200 at greater than about 100 degrees Celsius. For example, a sublimable solid, such as ammonium silicon fluoride (($NH_4)_2SiF_6$) may be converted to a combination of gases, such as silicon tetrafluoride ($SiF_4$), ammonia ($NH_3$) or hydrogen fluoride (HF) upon annealing at greater than about 100 degrees Celsius.

After the first layer 202 is removed, the substrate having the silicon-containing layer 200 may be transferred, for example, by a transfer robot via a transfer chamber, such as the transfer robot 510 and the first stage transfer chamber 506 of the system 500 described below, to a process chamber configured for epitaxial deposition, such as any of process chambers 512, 514, 516, or 518 as shown below. For example, the same process chamber may be utilized to perform both the annealing step 102 and a deposition step 106 as discussed below.

At 106, a second layer 210 may be deposited on the exposed surface of the silicon-containing layer 200. The second layer 210 may comprise one or more of the materials disclosed above for the silicon-containing layer 200. In addition, second layer 210 may comprise one or more of germanium (Ge), group III-V elements, or alloys formed therefrom, such as gallium arsenide (GaAs), aluminum arsenide (AlAs), indium arsenide (InAs), aluminum antimony (AlSb), Indium antimony (InSb), gallium antimony (GaSb), gallium phosphorus (GaP), aluminum phosphorus (AlP), indium phosphorus (InP) or the like. In some embodiments, the second layer is silicon germanium (SiGe). In some embodiments, the silicon-containing layer is silicon (Si) and the second layer is silicon germanium (SiGe). The second layer 210 may be deposited in any suitable manner, such as by chemical vapor deposition (CVD), atomic layer deposition (ALD), or the like. In some embodiments, the second layer 210 may comprise silicon germanium (SiGe) having 25 atomic percent germanium formed to a thickness of about 600 Angstroms.

Figure 3:
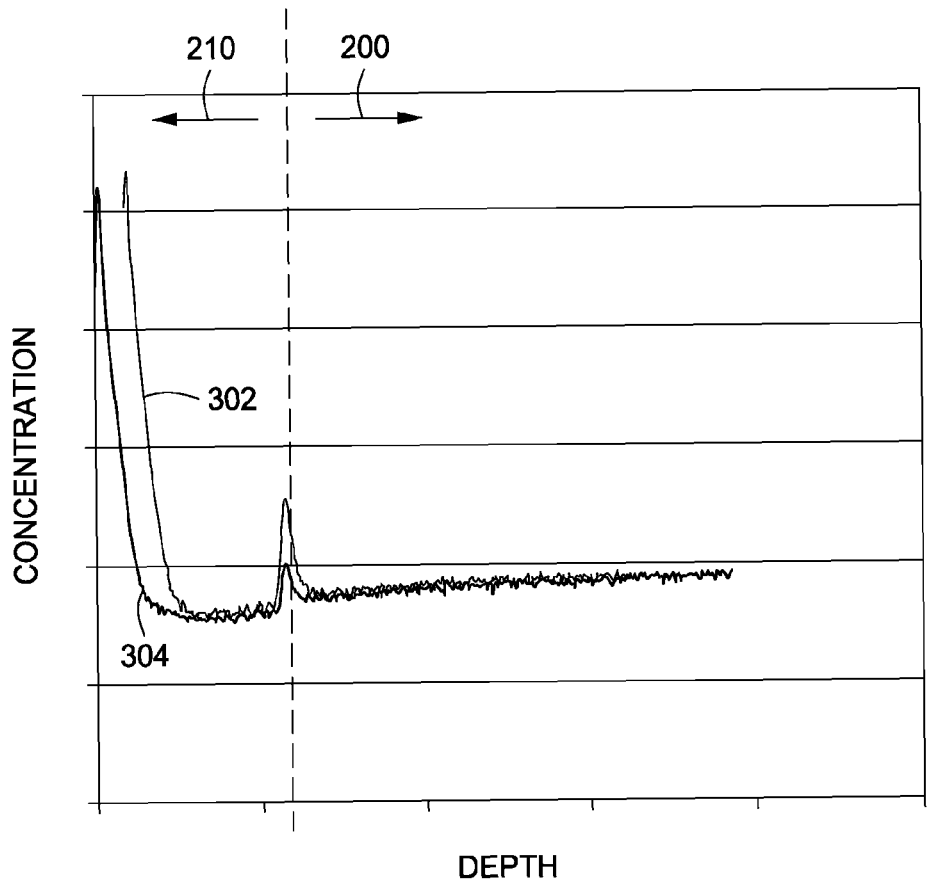
FIG. 3 depicts a comparison of contaminant concentration at the interface of adjacent layers deposited via prior art techniques and deposited via methods in accordance with some embodiments of the present invention.

Upon completion of deposition of the second layer 210, the method 100 generally ends and the substrate may continue being processed, as desired, to complete the formation of structures and/or devices thereupon. The substrate processed in accordance with the methods described herein may advantageously have reduced contamination at the interface between the silicon-containing layer 200 and the second layer 210. For example, FIG. 3 depicts a comparison of contaminant concentration at the interface of adjacent layers deposited according to prior art methods and deposited in accordance with the methods disclosed herein. The data shown in FIG. 3 was acquired using Secondary Ion Mass Spectroscopy (SIMS) and illustrates the concentration profiles of a contaminant, for example oxygen, at the interfaces between silicon-containing layers and second layers. Trace 302 illustrates a concentration profile at the interface of a silicon-containing layer and second layer formed without performing the method 100 of FIG. 1 and trace 304 illustrates a concentration profile at the interface of the silicon-containing layer 200 and the second layer 210 formed in accordance with the method 100. At the interface shown in trace 302, the concentration of oxygen is higher than at the interface shown in trace 304, formed by the method 100. For example, the inventors have found that the peak value of oxygen at the interface without performing the method 100, as shown in trace 302, can be about $4 \times 10^{18}$ atoms/cm$^3$, or ranging from about $2 \times 10^{18}$ atoms/cm$^3$ to about $8 \times 10^{18}$ atoms/cm$^3$. However, using embodiments of the present invention as described above with respect to the method 100, the inventors have found that, for example, when the annealing step 102 is performed at a temperature of about 550 degrees Celsius for a duration of about 10 seconds, the peak value of oxygen at the interface shown in trace 304 can be about $2 \times 10^{18}$ atoms/cm$^3$. Also, when the annealing step 102 is performed at a temperature of about 600 degrees Celsius for a duration of about 5 seconds, the peak value of oxygen at the interface shown in trace 304 can be less than about $1 \times 10^{18}$ atoms/cm$^3$. In some embodiments, the peak value of oxygen at the interface shown in trace 304 may be reduced to below the detection limit, which for oxygen is about $3 \times 10^{17}$ atoms/cm$^3$.

The etching processes described herein may be performed in any suitable etch chamber, such as the SICONI™ Preclean process chamber, available from Applied Materials, Inc. of Santa Clara, Calif., or other suitable etch chamber, such as described below with respect to FIG. 4. Further, additional details of the etch chamber described in FIG. 4 can be found in U.S. Pat. No. 7,494,545, entitled "EPITAXIAL DEPOSITION PROCESS AND APPARATUS," US Patent Application 2006/0130971, entitled "APPARATUS FOR GENERATING PLASMA BY RF POWER," and US Patent Application 2006/0051966, entitled "IN-SITU CHAMBER CLEAN PROCESS TO REMOVE BY-PRODUCT DEPOSITS FROM CHEMICAL VAPOR ETCH CHAMBER." Each of the aforementioned patents and applications are hereby incorporated herein by reference in their entireties. The etch chamber may be part of a cluster tool, such as one of the CENTURA® or ENDURA® line of cluster tools, also available from Applied Materials, Inc. An exemplary cluster tool is illustrated in FIG. 5.

Figure 4:
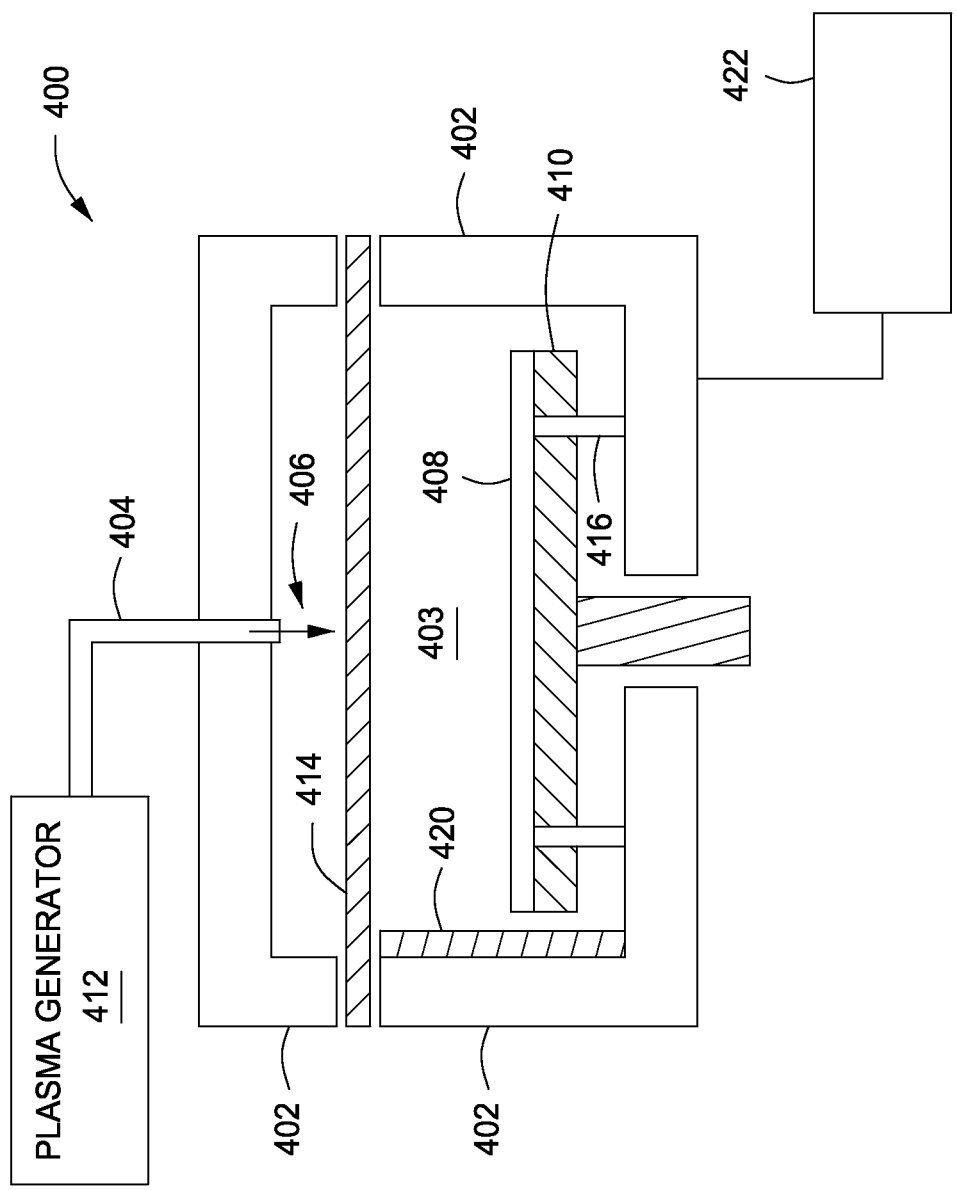
FIG. 4 depicts a partial cross sectional view of a process chamber suitable for performing methods in accordance with some embodiments of the present invention.
Figure 5:
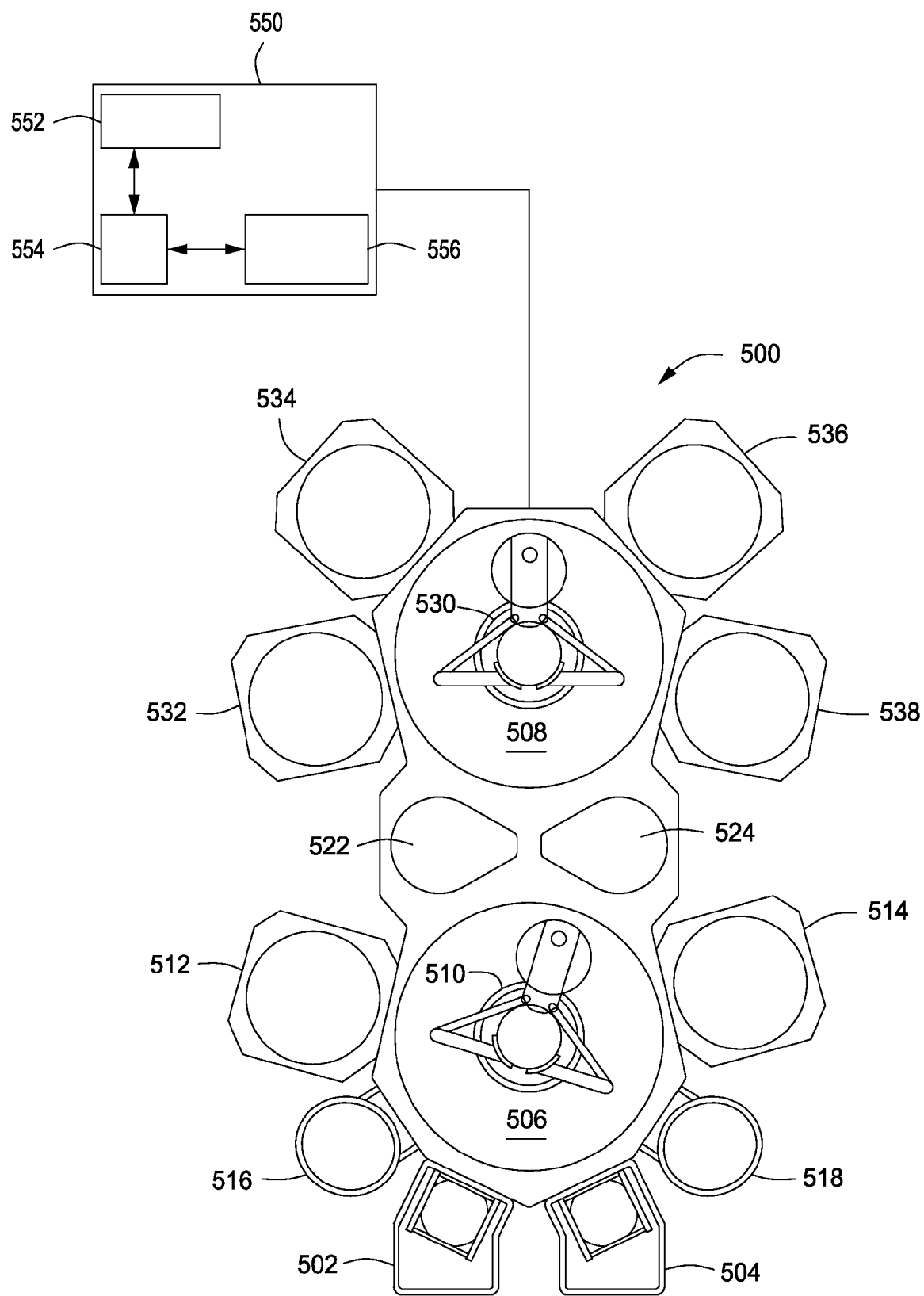
FIG. 5 depicts a schematic diagram of a process system suitable for performing methods in accordance with some embodiments of the present invention.

FIG. 4 is a schematic cross-sectional view of an exemplary etch chamber 400. The etch chamber 400 may include a chamber wall 402 enclosing a processing volume 403 and having a remote plasma generator 412 coupled thereto. The remote plasma generator 412 is configured to generate the plasma 406. The plasma generator 412 may be fluidly coupled to the processing volume 403 via a plasma distribution apparatus 404 such as a tube, pipe and/or manifold for delivering the process plasma 406 to the processing volume 403. Disposed within the processing volume 403 may be a substrate support pedestal 410 having a substrate 408 disposed thereon. The process plasma 406 may be delivered to the substrate 408 via a showerhead 414 that is position above the substrate 408. The substrate 408 may be moved controllably between a lower position/upper position near to a showerhead 414 by pins 416. The substrate 408 may include the silicon-containing layer 200 and the first layer 202 as described in FIG. 2A.

In some embodiments, the plasma distribution apparatus 404 may introduce the plasma 406 generated from the process gas into the process chamber 400. In some embodiments, the supply line for the etch plasma 406 may include: (i) several safety shut-off valves (not shown) that can be used to automatically or manually shut-off the flow of process plasmas into the chamber, and (ii) mass flow controllers (not shown) that measure the flow of the plasma 406 through the supply line.

The chamber wall 402 may have a temperature to substantially prevent condensations of etchants and/or byproducts thereon. The pedestal 410 may be operative to provide a desired temperature between about −100° C. and about 1000° C. to condense etchants on the surface of the substrate 408. The etchants then may desirably interact with the dielectric layers and additional layers as describe in the embodiments above.

In some embodiments, at least one pumping channel 420 may be configured within the etch chamber 500 to desirably remove byproducts such as excess process gases and/or decomposed gases from the etch chamber 400. The pumping channel 420 may be coupled to, for example, a pump or motor, such that the byproducts may be desirably removed. In some embodiments, the pumping channel 420 may have at least one aperture (not shown) through which the byproducts can be desirably removed.

In some embodiments, an RF power supply (not shown) may be coupled to the plasma generator 412 to excite the process gas to form the plasma 406. The RF power supply may be operative to provide a RF power between about 5 watts and about 3,000 watts. The RF power supply may supply the power at a RF frequency between about 100 kHz and about 64 MHz.

A system controller 422 may be coupled to the process chamber 400, and may controls all of the activities of the etch system. The system controller executes system control software, which is a computer program stored in a computer-readable medium such as a memory. In some embodiments, the memory is a hard disk drive, but the memory may also be other kinds of memory. The computer program includes sets of instructions that dictate the timing, mixture of gases, chamber pressure, chamber temperature and other parameters of a particular process. Other computer programs stored on other memory devices including, for example, a floppy disk or other another appropriate drive, may also be used to operate controller. In embodiments, where the process chamber 400 is coupled to a cluster tool (such as multi-chamber process system 500), the computer readable medium for performed the etching processes described herein may be stored in, and executed from, a system controller (such as controller 550) of the cluster tool.

FIG. 5 depicts a schematic top-view diagram of an illustrative multi-chamber process system 500 (e.g., cluster tool). The system 500 can include one or more load lock chambers 502, 504 coupled to a first stage transfer chamber 506 for transferring of substrates into and out of the system 500. Typically, since the system 500 is under vacuum, the load lock chambers 502, 504 may "pump down" the substrates introduced into the system 500. A first robot 510 may transfer the substrates between the load lock chambers 502, 504, and a first set of one or more substrate process chambers 512, 514, 516, 518 coupled to the first stage transfer chamber 506. Each process chamber 512, 514, 516, 518, can be outfitted to perform a number of substrate processing operations including the etching processes described herein in addition to cyclical layer deposition (CLD), atomic layer deposition (ALD), chemical vapor deposition (CVD), physical vapor deposition (PVD), etch, pre-clean, degas, orientation and other substrate processes. For example, in some embodiments, at least one process chamber of the system 500 is configured for epitaxial deposition and utilized for the annealing step 102 and the deposition step 106 of the method 100, and at least one process chamber of the system 500 is the process chamber 400 discussed above and configured for removing the first layer 202 using an etching process. However, the annealing step 102 and the deposition step 106 need not both be performed in the same chamber and may be performed in separate chambers of the system 500 which are capable of providing the process requirements of the annealing step 102 and the deposition step 106.

The first robot 510 can also transfer substrates to/from one or more transfer chambers 522, 524 disposed between the first stage transfer chamber 506 and a second stage transfer chamber 508. The transfer chambers 522, 524 can be used to maintain ultrahigh vacuum conditions while allowing substrates to be transferred within the system 500, such as between the first stage transfer chamber 506 and a second stage transfer chamber 508. A second robot 530 can transfer the substrates between the transfer chambers 522, 524 and a second set of one or more process chambers 532, 534, 536, and 538 coupled to the second stage transfer chamber 508. Similar to process chambers 512, 514, 516, 518, the process chambers 532, 534, 536, 538 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate process chambers 512, 514, 516, 518, 532, 534, 536, 538 may be removed from the system 500 if not necessary for a particular process to be performed by the system 500.

The system controller 550 controls the operation of the system 500 using a direct control of the process chambers 512, 514, 516, 518, 532, 534, 536, 538 or alternatively, by controlling the computers (or controllers) associated with the process chambers 512, 514, 516, 518, 532, 534, 536, 538 and the system 500. In operation, the system controller 550 enables data collection and feedback from the respective chambers and systems to optimize performance of the system 500. The system controller 550 generally includes a Central Processing Unit (CPU) 552, a memory 554, and a support circuit 556. The CPU 552 may be one of any form of a general purpose computer processor that can be used in an industrial setting. The support circuit 556 is conventionally coupled to the CPU 552 and may comprise a cache, clock circuits, input/output subsystems, power supplies, and the like. Software routines, such as the method 100 as described above, when executed by the CPU 552, transform the CPU 552 into a specific purpose computer (controller) 902. The software routines may also be stored and/or executed by a second controller (not shown) that is located remotely from the system 500.

Thus, methods of depositing layers having reduced interfacial contamination have been disclosed herein. The inventive methods advantageously may reduce contamination at the interface between layers, for example, between a deposited layer and an underlying substrate or film.

While the foregoing is directed to embodiments of the present invention, other and further embodiments of the invention may be devised without departing from the basic scope thereof.

The invention claimed is:

1. A method of depositing a layer, comprising:
   annealing a silicon-containing layer having a first layer disposed thereon in a reducing atmosphere comprising a reducing gas;
   removing the first layer using an etching process to expose the silicon-containing layer after annealing, wherein the etching process uses a plasma formed from an etchant gas that is different than the reducing gas; and
   depositing a second layer on the exposed silicon-containing layer.

2. The method of claim 1, wherein the silicon-containing layer comprises at least one of silicon (Si), silicon germanium (SiGe), silicon carbon (SiC), silicon phosphorus (SiP), silicon boron (SiB), silicon germanium boron (SiGeB), silicon germanium phosphorus (SiGeP), or silicon carbon phosphorus (SiCP).

3. The method of claim 1, wherein the first layer comprises an oxide layer.

4. The method of claim 1, wherein the first layer is silicon oxide ($SiO_2$).

5. The method of claim 1, wherein the reducing atmosphere comprises a reducing gas in a non-plasma state.

6. The method of claim 5, wherein the reducing gas comprises hydrogen ($H_2$), or hydrogen ($H_2$) and at least one of nitrogen ($N_2$), argon (Ar), or helium (He).

7. The method of claim 1, wherein the annealing step further comprises:
   annealing the silicon-containing layer at a temperature ranging from about 100 to about 700 degrees Celsius.

8. The method of claim 1, wherein the annealing step further comprises:
   annealing the silicon-containing layer at a temperature ranging from about 300 to about 700 degrees Celsius.

9. The method of claim 1, wherein the annealing step further comprises:
   annealing the silicon-containing layer at a temperature ranging from about 500 to about 700 degrees Celsius.

10. The method of claim 1, wherein the annealing step further comprises:
    annealing the silicon-containing layer for a duration of up to about 1 minute.

11. The method of claim 1, wherein the annealing step further comprises:
    annealing the silicon-containing layer for a duration of less than about 30 seconds.

12. The method of claim 1, wherein the annealing step further comprises:
    annealing the silicon-containing layer for a duration ranging from about 5 to about 10 seconds.

13. The method of claim 1, wherein the etchant gas comprises at least one of nitrogen trifluoride ($NF_3$) or ammonia ($NH_3$).

14. The method of claim 1, wherein the etching process further comprises:
    converting the first layer at least partially into a sublimable solid using the plasma.

15. The method of claim 14, wherein the etching process further comprises:
    removing the sublimable solid by annealing the silicon-containing layer at a temperature of greater than about 100 degrees Celsius.

16. The method of claim 1, wherein the silicon-containing layer is silicon (Si) and the second layer is silicon germanium (SiGe).

17. The method of claim 1, wherein the second layer comprises at least one of silicon (Si), silicon germanium (SiGe), silicon carbon (SiC), silicon phosphorus (SiP), silicon boron (SiB), silicon germanium boron (SiGeB), silicon germanium phosphorus (SiGeP), silicon carbon phosphorus (SiCP), gallium arsenide (GaAs), aluminum arsenide (AlAs), indium arsenide (InAs), aluminum antimony (AlSb), Indium antimony (InSb), gallium antimony (GaSb), gallium phosphorus (GaP), aluminum phosphorus (AlP), or indium phosphorus (InP).

18. The method of claim 1, further comprising:
    performing the anneal in a first chamber;
    transferring the silicon-containing layer between the first chamber and a second chamber in an inert atmosphere;
    performing the removal in the second chamber;
    transferring the silicon-containing layer between the second chamber and a third chamber in an inert atmosphere; and
    performing the deposition in the third chamber, wherein the first chamber and the third chamber are either the same chamber or a different chamber.

19. A method of depositing a layer, comprising:
    annealing a silicon-containing layer having a first layer disposed thereon in a reducing atmosphere comprising a reducing gas and at a temperature ranging from about 100 to about 700 degrees Celsius;
    removing the first layer using an etching process to expose the silicon-containing layer after annealing, wherein the etching process uses a plasma formed from an etchant gas that is different than the reducing gas;
transferring the silicon-containing layer to a deposition process chamber in an inert atmosphere; and
depositing a second layer on the exposed silicon-containing layer.

* * * * *